(12) United States Patent
Kim

(10) Patent No.: US 10,593,374 B2
(45) Date of Patent: Mar. 17, 2020

(54) MEMORY MODULE

(71) Applicant: SK hynix Inc., Gyeonggi-do (KR)

(72) Inventor: Hyun-Seok Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 234 days.

(21) Appl. No.: 15/724,354

(22) Filed: Oct. 4, 2017

(65) Prior Publication Data
US 2018/0211694 A1 Jul. 26, 2018

(30) Foreign Application Priority Data

Jan. 23, 2017 (KR) ........................ 10-2017-0010339

(51) Int. Cl.
| | | |
|---|---|---|
| *G11C 5/04* | (2006.01) | |
| *G11C 7/22* | (2006.01) | |
| *G06F 13/16* | (2006.01) | |
| *G11C 29/04* | (2006.01) | |

(52) U.S. Cl.
CPC ............ *G11C 5/04* (2013.01); *G06F 13/1694* (2013.01); *G11C 7/222* (2013.01); *G11C 7/225* (2013.01); *G11C 2029/0411* (2013.01)

(58) Field of Classification Search
CPC ........... G11C 5/04; G11C 7/222; G11C 7/225; G11C 2029/04411; G06F 13/1694
See application file for complete search history.

(56) References Cited

U.S. PATENT DOCUMENTS

| | | | | |
|---|---|---|---|---|
| 4,945,518 A | * | 7/1990 | Muramatsu | G06F 5/16 326/17 |
| 5,508,967 A | * | 4/1996 | Karino | G11C 7/1036 365/219 |
| 6,191,991 B1 | * | 2/2001 | Wada | G11C 7/1006 365/219 |
| 8,171,378 B2 | | 5/2012 | Choi et al. | |
| 8,634,269 B2 | * | 1/2014 | Kim | G11C 7/1057 365/189.15 |
| 9,160,520 B1 | * | 10/2015 | Hwang | G11C 7/222 |
| 2005/0251713 A1 | * | 11/2005 | Lee | G11C 8/16 714/718 |
| 2006/0047899 A1 | * | 3/2006 | Ilda | G06F 3/0619 711/113 |

(Continued)

*Primary Examiner* — Ramon A. Mercado
(74) *Attorney, Agent, or Firm* — IP & T Group LLP

(57) ABSTRACT

A memory module includes a front side interface configured to serial-to-parallel convert a command, an address, and data, based on a host clock, and transfer the converted command, address, and data; a processing block configured to operate in synchronization with a division clock, process the command, address, and data transferred from the front side interface, and transfer the processed command, address, and data; a back side interface configured to include a PLL for generating a media clock having a frequency different from the host clock, to parallel-to-serial convert the command, address, and data transferred from the processing block, based on the media clock, and to transfer the converted command, address, and data; and memory devices configured to operate in synchronization with the media clock, and to write the data transferred from the back side interface therein in response to the command and address transferred from the back side interface.

19 Claims, 3 Drawing Sheets

(56) References Cited

U.S. PATENT DOCUMENTS

| | | | | |
|---|---|---|---|---|
| 2013/0250712 A1* | 9/2013 | Byun | ........................ | G11C 8/18 |
| | | | | 365/230.03 |
| 2014/0010029 A1* | 1/2014 | Jung | ...................... | G11C 7/222 |
| | | | | 365/194 |
| 2014/0344654 A1* | 11/2014 | Lee | ......................... | G06F 11/10 |
| | | | | 714/807 |
| 2014/0355363 A1* | 12/2014 | Byeon | ..................... | G11C 7/222 |
| | | | | 365/189.17 |
| 2015/0048957 A1* | 2/2015 | Jeon | ........................ | H03M 9/00 |
| | | | | 341/100 |
| 2017/0060682 A1* | 3/2017 | Kodera | ................ | G06F 11/1044 |
| 2017/0286213 A1* | 10/2017 | Li | ......................... | G06F 3/0619 |

* cited by examiner

MEMORY MODULE

CROSS-REFERENCE TO RELATED APPLICATIONS

The present application claims priority of Korean Patent Application No. 10-2017-0010339, filed on Jan. 23, 2017, which is incorporated herein by reference in its entirety.

BACKGROUND

1. Field

Exemplary embodiments relate to a memory module.

2. Description of the Related Art

Recently, as mobile communication terminals such as smart phones and tablet PCs are widely spread and the use of a social network service (SNS), a M2M (Machine to Machine), a sensor network and the like is increased, the amount, the generation speed, and the diversity of data are exponentially increased. In order to process big data, a memory speed is important, but a memory device and the storage capacity of a memory module including the same should be very large.

In the case of a dual in-line memory module (DIMM) type memory module used as a system memory at the present time, an operation speed of a host side and an operation speed of a memory device in the memory module should be equal to each other. However, when the memory module is fabricated with a high capacity, since the number of memory devices included in the memory module is increased, loading is increased, and routing of numerous signals becomes difficult, it is difficult to substantially maintain the operation speeds of the memory devices to be equal to the operation speed of the host side.

SUMMARY

Various embodiments are directed to a memory module including memory devices that operate at speeds different from an operation speed of a host side.

A memory module in accordance with an embodiment may include a front side interface configured to serial-to-parallel convert a command, an address, and data received from a host memory controller based on a host clock, received from the host memory controller, and transfer the converted command, address, and data; a processing block configured to operate in synchronization with a division clock, process the command, address, and data transferred from the front side interface, and transfer the processed command, address, and data a back side interface configured to include a phase locked loop for generating a media clock having a frequency different from a frequency of the host clock, to parallel-to-serial convert the command, address, and data transferred from the processing block, based on the media clock, and to transfer the converted command, address and data; and one or more memory devices configured to operate in synchronization with the media clock and to write the data transferred from the back side interface therein in response to the command and address transferred from the back side interface.

The frequency of the media dock may be lower than the frequency of the host clock.

The phase locked loop may generate the media clock by using the host clock as a reference dock.

The back side interface may further include an oscillator for generating a reference clock, wherein the phase locked loop may generate the media clock by using the reference clock.

The back side interface may further include a divider for generating the division clock by dividing the media clock.

The back side interface may further include a first delay locked loop configured to generate a first data strobe signal for strobing data to be transferred to the memory devices the back side interface, by using the media dock.

Each of the one or more memory devices may include a second delay locked loop configured to generate a second data strobe signal for strobing data to be transferred to the back side interface from the memory devices, by using the media clock.

The front side interface may include a third delay locked loop configured to generate a third data strobe signal for strobing data to be transferred to the host memory controller from the front side interface, by using the host dock.

The back side interface may serial-to-parallel convert data transferred from the memory devices and transfers the converted data to the processing block, and the front side interface may parallel-to-serial convert data transferred from the processing block and transfers the converted data to the host memory controller.

The memory module may further include a first domain crossing circuit configured to perform domain crossing between the front side interface and the processing block; and a second domain crossing circuit configured to perform domain crossing between the processing block and the back side interface.

The processing block may include a control signal processing block configured to process the command and address from the front side interface to the back side interface in synchronization with the division clock; and a data processing block configured to process the data from the front side interface to the back side interface in synchronization with the division clock.

The control signal processing block may transfer the command and address transferred from the front side interface to the back side interface, and perform an operation instructed by the command and address transferred from the front side interface.

The data processing block may include an error correction code generation circuit configured to generate an error correction code by using the data transferred from the front side interface; and an error correction circuit configured to correct an error of data transferred from the back side interface by using an error correction code transferred from the back side interface, wherein the back side interface parallel-to-serial converts the error correction code transferred from the processing block together with the data transferred from the processing block, and in the memory devices, the error correction code transferred from the back side interface is written together with the data transferred from the back side interface.

The front side interface, the processing block, and the back side interface may be included in a module controller.

A memory module may include a front side interface configured to include a first command/address receiving unit that receives an address and a command from a host memory controller, a first data transmitting/receiving unit that transmits/receives data to/from the host memory controller, a first dock receiving unit that receives a host clock from the host memory controller, and a first serializer/deserializer that serial-to-parade converts the command and address received from the first command/address receiving unit, based on the host clock received from the first clock receiving unit, to transfer the converted command, address, and data to a processing block, and parallel-to-serial converts data transferred from the processing block to transfer the converted data to the first data transmitting/receiving unit; the processing block configured to operate in synchronization with a division clock, and include a control signal processing block that processes the command and address transferred from the front side interface, and transfer the processed command and address to a back side interface, and a data processing block that generates an error correction code by using the data transferred from the front side interface, and corrects an error of data transferred from the back side interface by using an error correction code transferred from the back side interface; the back side interface configured to include a phase locked loop that generates a media clock having a frequency different from a frequency of the host clock, a second serializer/deserializer that parallel-to-serial converts the command, address, data, and error correction code transferred from the processing block, based on the media dock, and serial-to-parallel converts data and an error correction code transferred from one or more memory devices, a command/address transmitting unit that transmits the command and address transferred from the second serializer/deserializer, a second data transmitting/receiving unit that transmits/receives the data and the error correction code between the second serializer/deserializer and the memory devices, and a clock transmitting unit that transmits the media dock; and the one or more memory devices configured to operate in synchronization with the media dock, wherein each of the memory devices comprises: a second clock receiving unit configured to receive the media clock transferred from the clock transmitting unit; a second command/address receiving unit configured to receive the command and address transferred from the command/address transmitting unit, and a third data transmitting/receiving unit configured transmit/receive the data and the error correction code to/from the second data transmitting/receiving unit.

The frequency of the media dock may be lower than the frequency of the host clock.

The back side interface may further include a divider configured to generate the division clock by dividing the media clock.

The front side interface may further include a first delay locked loop configured to generate a first data strobe signal for strobing the data to be transmitted from the first data transmitting/receiving unit, by using the host clock, the back side interface further comprises: a second delay locked loop configured to generate a second data strobe signal for strobing the data and the error correction code to be transmitted from the second data transmitting/receiving unit, by using the media clock and each of the memory devices comprises: a third delay locked loop configured to generate a third data strobe signal for strobing the data and the error correction code to be transmitted from the third data transmitting/receiving unit, by using the media clock.

The front side interface may include a first domain crossing circuit configured to perform domain crossing between the front side interface and the processing block, and the back side interface comprises: a second domain crossing circuit configured to perform domain crossing between the processing block and the back side interface.

The control signal processing block may transfer the command and address transferred from the front side interface to the back side interface, and perform an operation instructed by the command and address transferred from the front side interface.

According to embodiments, it is possible to allow memory devices in a memory module to operate at speeds different from an operation speed of a host side.

DETAILED DESCRIPTION

Figure 1:
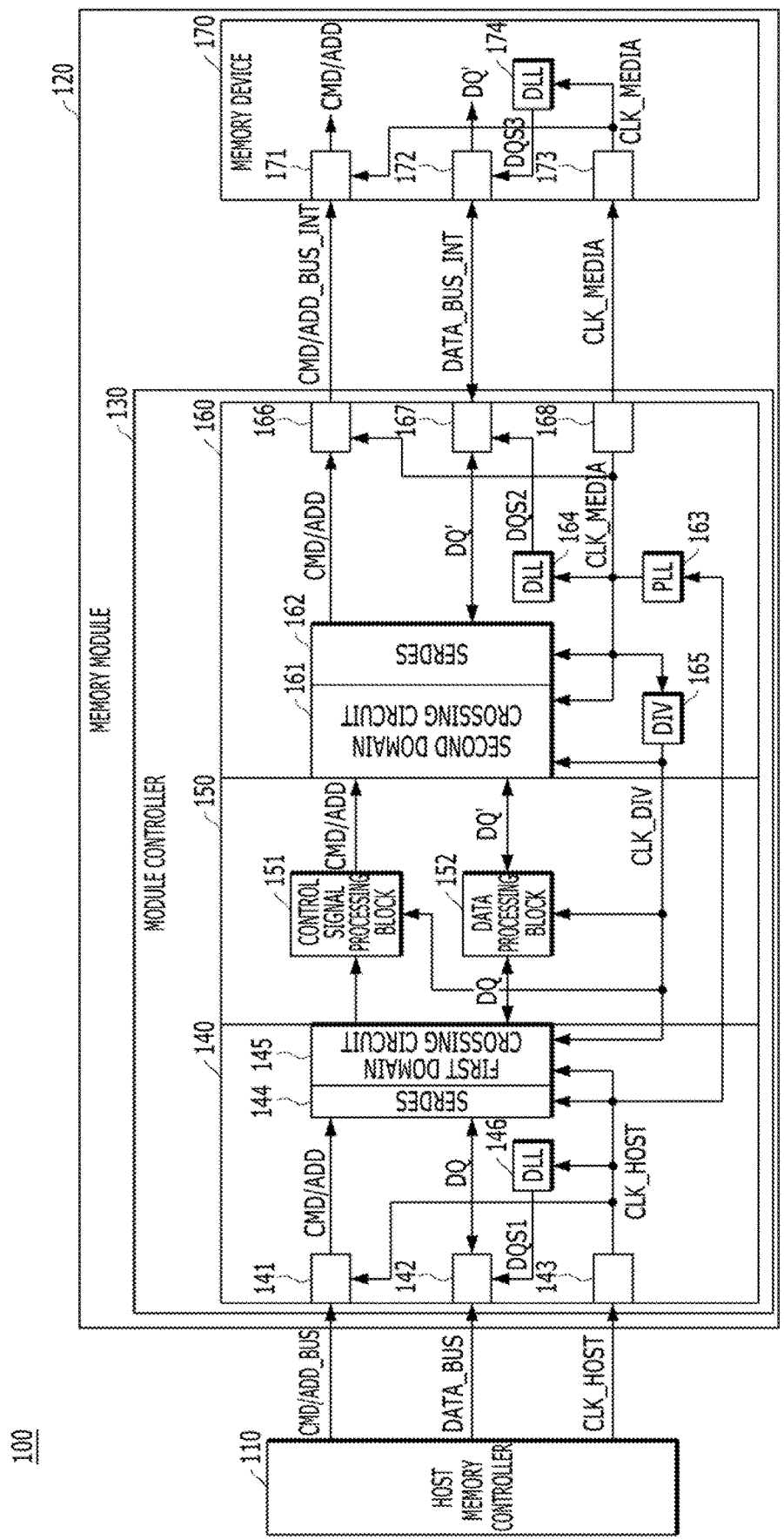
FIG. 1 is a block diagram illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
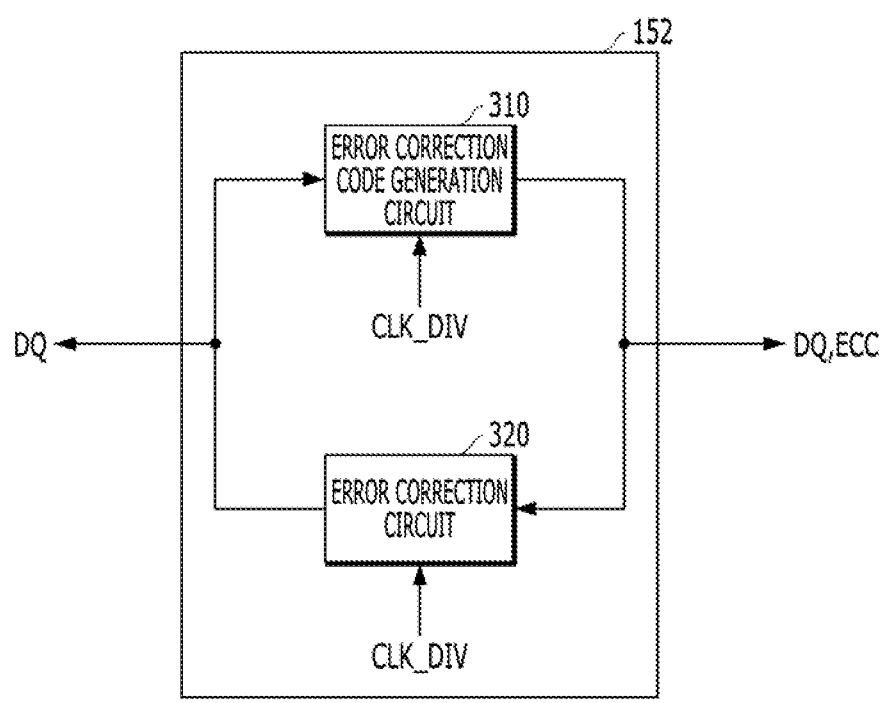
FIG. 2 is a block diagram illustrating a data processing block FIG. 1.

FIG. 1 is a block diagram illustrating a memory system 100 in accordance with an embodiment of the present invention. FIG. 2 is a block diagram illustrating a data processing block 152 of FIG. 1.

Referring FIG. 1, the memory system 100 may include a host memory controller 110 and a memory module 120.

The host memory controller 110 may transmit a command and an address to the memory module 120 through a control bus CMD/ADD_BUS. The host memory controller 110 may transmit/receive data to/from the memory module 120 through a data bus DATA_BUS. The host memory controller 110 may apply the command and the address to the memory module 120 to control the memory module 120, may transmit data to be written to the memory module 120 in a write operation, and receive data read from the memory module 120 in a read operation. The host memory controller 110 may transmit a host clock CLK_HOST to be used in the memory module 120. Signal transmission between the host memory controller 110 and the memory module 120 may be performed according to a DDR PHY Interface (DFI) standard protocol.

The control bus CMD/ADD_BUS may include a plurality of transmission lines for transmitting the command and the address. The data bus DATA_BUS may include a plurality of transmission lines for transmitting data DQ and a data strobe signal DQS for strobing the data DQ. The host dock CLK_HOST transmitted to the memory module 120 from the host memory controller 110 may be transmitted in a single-ended scheme or a differential scheme.

The memory module 120 may include a module controller 130 and a memory device 170. The memory module 120 may be a dual in-line memory module (DIMM) type memory module.

The module controller 130 may include a front side interface 140, a processing block 150, and a back side interface 160.

The front side interface 140 may be an interface for communication between the memory module 120 and the host memory controller 110. The front side interface 140 is also called a front side PHY. The front side interface 140 may include a first command/address receiving unit 141, a first data transmitting/receiving unit 142, a first clock receiving unit 143, a first serializer/deserializer (SERDES) 144, a first domain crossing circuit 145, and a first delay locked loop (DLL) 146.

The first clock receiving unit 143 may receive the host clock CLK_HOST transferred from the host memory controller 110, The first command/address receiving unit 141 may receive the command and the address CMD/ADD transferred through the control bus CMD/ADD_BUS. The first command/address receiving unit 141 may receive the command and the address CMD/ADD in synchronization with the host clock CLK_HOST. The first data transmitting/receiving unit 142 may receive the data DQ transferred from the host memory controller 110 through the data bus DATA_BUS, or transmit the data DQ to the host memory controller 110 through the data bus DATA_BUS. When receiving the data DQ, the first data transmitting/receiving unit 142 may receive the data DQ in synchronization with the data strobe signal DQS received through the data bus DATA_ BUS. Furthermore, when transmitting the data DQ, the first data transmitting/receiving unit 142 may transmit the data DQ in synchronization with a first data strobe signal DQS1 generated by the first DLL 146, and may transmit the first data strobe signal DQS1 to the host memory controller 110 through the data bus DATA_BUS together with the data DQ. The memory module 120 may further include a data buffer (not illustrated) for buffering the data DQ transferred between the first data transmitting/receiving unit 142 and the host memory controller 110.

The first SERDES 144 may serial-to-parallel convert the command and the address CMD/ADD received from the first command/address receiving unit 141, and transfer the converted command and address to the first domain crossing circuit 145. For example, the first SERDES 144 may serial-to-parallel convert the command and the address CMD/ADD at the rate of 1:4. Furthermore, the first SERDES 144 may serial-to-parallel convert the data DQ received from the first data transmitting/receiving unit 142, and transfer the converted data to the first domain crossing circuit 145. For example, the first SERDES 144 may serial-to-parallel convert the data DQ received from the first data transmitting/receiving unit 142 at the rate of 1:4, and transfer the converted data to the first domain crossing circuit 145. Furthermore, the first SERDES 144 may parallel-to-serial convert data transferred from the first domain crossing circuit 145, and transfer the converted data to the first data transmitting/receiving unit 142. For example, the first SERDES 144 may parallel-to-serial convert the data transferred from the first domain crossing circuit 145 at the rate of 4:1, and transfer the converted data to the first data transmitting/receiving unit 142. In the serial-to-parallel conversion operation and parallel-to-serial conversion operation of the first SERDES 144, the host clock. CLK_HOST may be used. The first SERDES 144 is also called a SERDES circuit.

The first DLL 146 may generate the first data strobe signal DQS1 for strobing the data DQ to be transmitted from the first data transmitting/receiving unit 142 to the host memory controller 110, by using the host clock CLK_HOST. The first DLL 146 generates the first data strobe signal DQS1 by delaying the host clock CLK_HOST, so that time delay occurring in the front side interface 140 may be compensated.

The first domain crossing circuit 145 may perform a domain crossing operation on the command and the address CMD/ADD and the data DQ transmitted between the front side interface 140 operating based on the host dock CLK_HOST and the processing block 150 operating based on a division dock CLK_DIV. The first domain crossing circuit 145 may include asynchronous first-in-first-out (FIFO) circuits for performing domain crossing on the command and the address CMD/ADD and the data DQ, and transferring the domain-crossed command, address, and data from the front side interface 140 to the processing block 150, and asynchronous FIFO circuits for performing domain crossing on the data DQ and transferring the domain-crossed data from the processing block 150 to the front side interface 140. The input operation of the command and the address CMD/ADD and the data DQ from the first SERDES 144 to the first domain crossing circuit 145 and the output operation of the data DQ from the first domain crossing circuit 145 to the first SERDES 144 may be performed in synchronization with the host clock CLK_HOST. The output operation of the command and the address CMD/ADD and the data DQ from the first domain crossing circuit 145 to the processing block 150 and the input operation of the data DQ from the processing block 150 to the first domain crossing circuit 145 may be performed in synchronization with the division clock CLK_DIV.

The processing block 150 operates in synchronization with the division clock and may include a control signal processing block 151 and the data processing block 152.

The control signal processing block 151 may process the command and the address CMD/ADD from the front side interface 140 to the back side interface 160 in synchronization with the division dock CLK_DIV. The control signal processing block 151 may transfer the command and the address CMD/ADD from the front side interface 140 to the back side interface 160. The control signal processing block 151 may perform an operation instructed by the command and the address CMD/ADD. For example, in the case in which a specific parameter is set by a setting command such as mode register set (MRS), and the specific parameter is required to be set in the memory module 120 other than the memory device 170, the control signal processing block 151 may perform the setting operation. Furthermore, the control signal processing block 151 may perform a timing adjustment operation when timing adjustment of the command and the address CMD/ADD, which are to be transferred to the back side interface 160 is required.

The data processing block 152 may process the data DQ transferred from the front side interface 140 to the back side interface 160 in synchronization with the division dock CLK_DIV. Referring to FIG. 2, the data processing block 152 may include an error correction code generation circuit 310 and an error correction circuit 320. The error correction code generation circuit 310 may generate an error correction code (ECC) by using the data DQ transferred from the front side interface 140. That is, the error correction code generation circuit 310 may generate the error correction code (ECC) by using the data DQ in the write operation. The error correction circuit 320 may correct an error of the data DQ, which has been transferred from the back side interface 160, by using the error correction code (ECC) transferred from the back side interface 160, and transfer the corrected data to the front side interface 140. That is, in the read operation, the error correction circuit 320 may correct the error of the data DQ by using the error correction code (ECC). In order to reduce the cost while increasing the capacity of the memory module 120 for the processing of big data, it is necessary to use the memory device 170 which has a large capacity but has a low manufacturing cost, that is, a relatively low quality. Furthermore, in order to reduce a current consumed in the memory device 170 with a large capacity, a refresh cycle of the memory device 170 should be increased. In this case, relatively many errors occur in the memory device 170. The data processing block 152 may also be used in order to correct such an error. The reference numeral "DQ'" of FIG. 1 may include the data DQ and the error correction code (ECC) of FIG. 3.

Referring back to FIG. 1, the back side interface 160 may be an interface for communication between the module controller 130 and the memory device 170. The back side interface 160 is also called a back side PHY. The back side interface 160 may include a second domain crossing circuit 161, a second serializer/deserializer (SERDES) 162, a phase locked loop (PLL) 163, a second delay locked loop (DLL) 164, a divider 165, a command/address transmitting unit 166, a second data transmitting/receiving unit 167, and a clock transmitting unit 168.

The PLL 163 may generate a media dock CLK_MEDIA having a frequency different from that of the host dock CLK_HOST. The PLL 163 may generate the media clock CLK_MEDIA by using the host clock CLK_HOST as a reference clock. The media clock CLK_MEDIA may have a frequency lower than that of the host clock CLK_HOST. For example, the media clock CLK_MEDIA may have a frequency corresponding to a half of a frequency of the host clock CLK_HOST.

The divider 165 may generate the division clock CLK_DIV by dividing the media clock CLK_MEDIA generated by the PLL 163. The division clock CLK_DIV may have a frequency lower than that of the media clock CLK_MEDIA. For example, the division clock CLK_DIV may have a frequency corresponding to a half of a frequency of the media clock CLK_MEDIA that is, a frequency corresponding to a quarter of a frequency of the host clock CLK_HOST.

The second domain crossing circuit. 161 may perform a domain crossing operation on the command and the address CMD/ADD, and the data and the error correction code DQ' transmitted between the processing block 150 operating based on the division clock CLK_DIV and the back side interface 160 operating based on the media clock CLK_MEDIA. The second domain crossing circuit 161 may include asynchronous FIFO circuits for performing domain crossing on the command and the address CMD/ADD, and the data and the error correction code DQ', and transferring the domain-crossed command, address, data, and code from the processing block 150 to the back side interface 160, and asynchronous FIFO circuits for performing domain crossing on the data and the error correction code DQ' and transferring the domain-crossed data and code from the back side interface 160 to the processing block 150. The input operation of the command and the address CMD/ADD, and the data and the error correction code DQ' from the processing block 150 to the second domain crossing circuit 161 and the output operation of the data and the error correction code DQ' from the second domain crossing circuit 161 to the processing block 150 may be performed in synchronization with the division clock CLK_DIV. The output operation of the command and the address CMD/ADD, and the data and the error correction code DQ' from the second domain crossing circuit 161 to the second SERDES 162 and the input operation of the data and the error correction code DQ' from the second SERDES 162 to the second domain crossing circuit 161 may be performed in synchronization with the media clock CLK_MEDIA.

The second SERDES 162 may parallel-to-serial convert the command and the address CMD ADD transferred from the second domain crossing circuit 161, and transfer the converted command and address to the command/address transmitting unit 166. For example, the second SERDES 162 may parallel-to-serial convert the command and the address CMD/ADD transferred from the second domain crossing circuit 161 at the rate of 4:1, and transfer the converted command and address to the command/address transmitting unit 166. Furthermore, the second SERDES 162 may parallel-to-serial convert the data and the error correction code DQ' transferred from the second domain crossing circuit 161, and transfer the converted data and code to the second data transmitting/receiving unit 167. For example, the second SERDES 162 may parallel-to-serial convert the data and the error correction code DQ' transferred from the second domain crossing circuit 161 at the rate of 4:1, and transfer the converted data and code to the second data transmitting/receiving unit 167. Furthermore, the second SERDES 162 may serial-to-parallel convert data and the error correction code DQ' transferred from the second data transmitting/receiving unit 167, and transfer the converted data and code to the second domain crossing circuit 161. For example, the second SERDES 162 may serial-to-parallel convert the data and the error correction code DQ' transferred from the second data transmitting/receiving unit 167 at the rate of 1:4, and transfer the converted data and code to the second domain crossing circuit 161. The second SERDES 162 is also called a SERDES circuit.

The second DLL 164 may generate a second data strobe signal DQS2 for strobing the data and the error correction code DQ' to be transmitted from the second data transmitting/receiving unit 167 to the memory device 170 by using the media clock CLK_MEDIA. The second DLL 164 generates the second data strobe signal DQS2 by delaying the media clock CLK_MEDIA, so that time delay occurring in the back side interface 160 may be compensated.

The dock transmitting unit 168 may transmit the media dock CLK_MEDIA to the memory device 170. The command/address transmitting unit 166 may transmit the command and the address CMD/ADD transferred from the second SERDES 162 to the memory device 170. The command/address transmitting unit 166 may transmit the command and the address CMD/ADD to the memory device 170 through an internal control bus CMD/ADD_BUS_INT in synchronization with the media clock CLK_MEDIA. The second data transmitting/receiving unit 167 may transmit the data and the error correction code DQ' to the memory device 170 through an internal data bus DATA_BUS_INT or receive the data and the error correction code DQ' transferred from the memory device 170 through the internal data bus DATA_BUS_INT. When receiving the data and the error correction code DQ', the second data transmitting/receiving unit 167 may receive the data and the error correction code DQ' in synchronization with a third data strobe signal DQS3 received from the internal data bus DATA_BUS_INT. When transmitting the data and the error correction code DQ', the second data transmitting/receiving unit 167 may transmit the data and the error correction code DQ' in synchronization with the second data strobe signal DQS2 generated by the second DLL 164 and may transmit the second data strobe signal DQS2 to the memory device 170 through the internal data bus DATA_BUS_INT together with the data and the error correction code DQ'. The buses CMD/ADD_BUS_INT and DATA_BUS_INT are written with "INT" in order to represent an internal bus of the memory module 120.

The memory device 170 may operate in synchronization with the media clock CLK_MEDIA, may be controlled by the command and the address CMD/ADD transmitted through the internal control bus CMD/ADD_BUS_INT, and may operate while transmitting/receiving the data and the error correction code DQ' through the internal data bus DATA_BUS_INT. The memory device 170 may be one of dynamic random access memory (DRAM) and other types of memories. The memory device 170 may include a second command/address receiving unit 171, a third data transmitting/receiving unit 172, a second clock receiving unit 173, and a third delay locked loop (DLL) 174. In addition to this, the memory device 170 may include a cell array, circuits for reading and writing data from/to the cell array, and various control circuits; however, these have no direct relation to the invention these are not illustrated. FIG. 1 illustrates only one memory device 170; however, this is for illustrative purposes only and it is of course that a plurality of memory devices 170 may be actually provided in the memory system 100.

The second clock receiving unit 173 may receive the media clock CLK_MEDIA to be used in the memory device 170. The second command/address receiving unit 171 may receive the command and the address CMD/ADD transmitted through the internal control bus CMD/ADD_BUS_INT. The second command/address receiving unit 171 may receive the command and the address CMD/ADD in synchronization with the media dock CLK_MEDIA.

The third DLL 174 may generate the third data strobe signal DQS3 for strobing the data and the error correction code DQ' to be transmitted from the third data transmitting/receiving unit 172 to the module controller 130, by using the media clock CLK_MEDIA. The third DLL 174 generates the third data strobe signal DQS3 by delaying the media clock CLK_MEDIA, so that time delay occurring in the memory device 170 may be compensated.

The third data transmitting/receiving unit 172 may transmit/receive the data and the error correction code DQ' to/from the second data transmitting/receiving unit 167 of the module controller 130 through the internal data bus DATA_BUS_INT. When receiving the data and the error correction code DQ', the third data transmitting/receiving unit 172 may receive the data and the error correction code DQ' in synchronization with the second data strobe signal DQS2 received from the internal data bus DATA_BUS_INT. Furthermore, when transmitting the data and the error correction code DQ the third data transmitting/receiving unit 172 may transmit the data and the error correction code DQ' in synchronization with the third data strobe signal DQS3 generated by the third DLL 174, and may transmit the third data strobe signal DQS3 to the second data transmitting/receiving unit 167 through the internal data bus DATA_BUS_INT together with the data and the error correction code DQ'.

In the memory system 100 of FIG. 1, the module controller 130 includes the front side interface 140 which serial-to-parallel converts a command, an address, and data based on the host clock CLK_HOST and the back side interface 160 which parallel-to-serial converts the command, address, and data based on the media clock CLK_MEDIA having a frequency different from the host clock CLK_HOST. Accordingly, it is possible to allow the memory device 170 in the memory module 120 to operate at speeds different from the operation speed of the host side, that is, the host memory controller 110, by using the first and second data strobe signals DQS1 and DQS2 in the module controller 130. Consequently, the memory device 170 with a large capacity but a relatively slow operation speed is available in the memory system 100.

Figure 3:
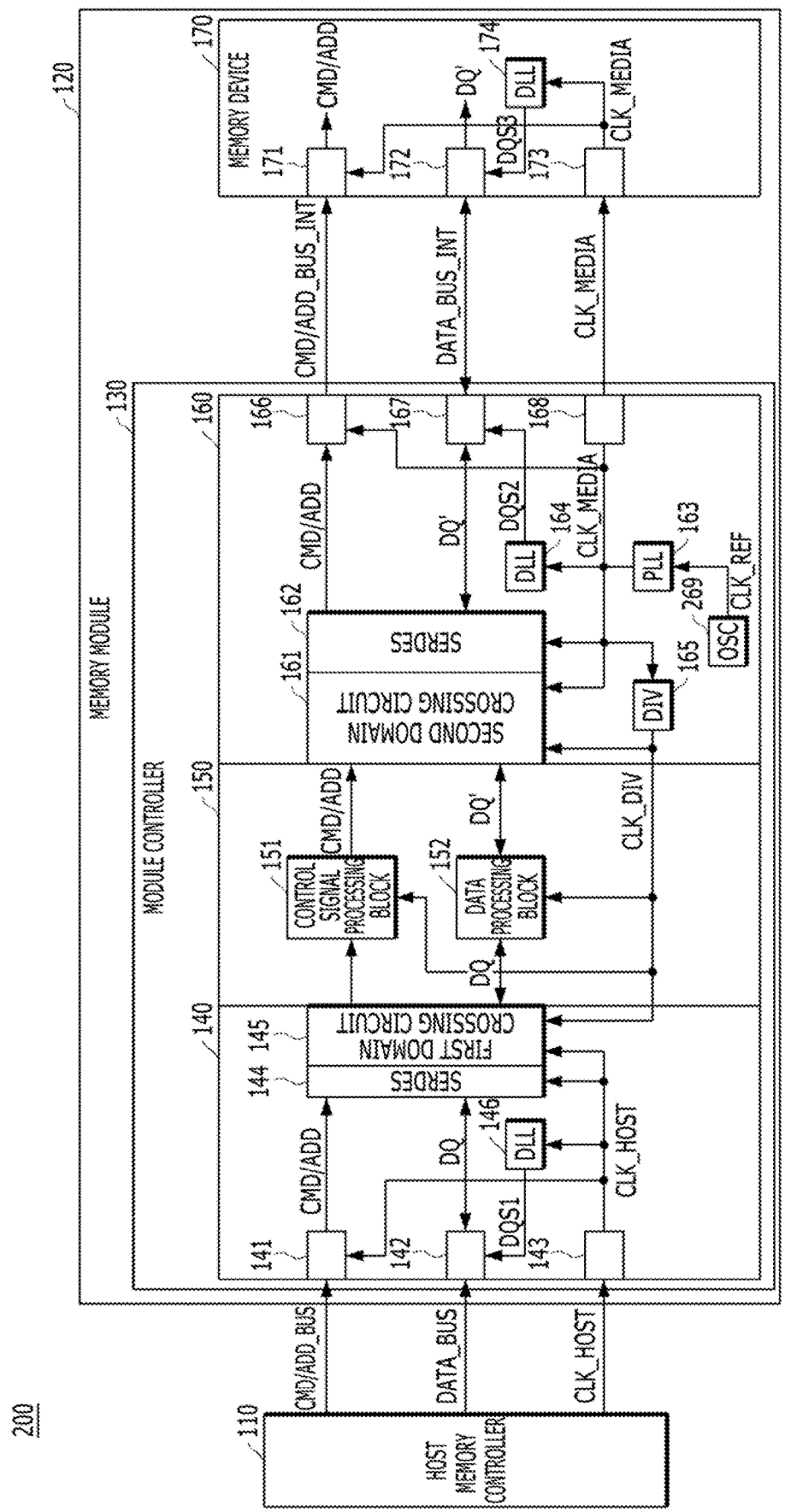
FIG. 3 is a block diagram illustrating a memory system in accordance with another embodiment of the present invention.

FIG. 3 is a block diagram illustrating a memory system 200 in accordance with another embodiment of the present invention.

Referring to FIG. 3, the memory system 200 may further include an oscillator 269 for generating a reference clock CLK_REF in the back side interface 160 as compared with the memory system 100 of FIG. 1. The PLL 163 of FIG. 1 generates the media clock CLK_MEDIA by using the host clock CLK_HOST as a reference clock, but the PLL 163 of FIG. 3 may generate the media clock CLK_MEDIA by using the reference clock CLK_REF generated by the oscillator 269 as a reference clock. The memory system 100 of FIG. 1 and the memory system 200 of FIG. 3 may have substantially the same configuration and perform substantially the same operations except for the type of a reference clock used in the PLL 163.

Although various embodiments have been described for illustrative purposes, it will be apparent to those skilled in the art that various changes and modifications may be made without departing from the spirit and scope of the invention as defined in the following claims.

What is claimed is:

1. A memory module comprising:
   a front side interface configured to serial-to-parallel convert a command, an address, and data received from a host memory controller, based on a host clock received from the host memory controller, and transfer the converted command, address, and data;
   a processing block configured to operate in synchronization with a division clock, process the command, address, and data transferred from the front side interface, and transfer the processed command, address, and data;
   a back side interface configured to include a phase locked loop for generating a media clock having a frequency different from a frequency of the host clock, to parallel-to-serial convert the command, address, and data transferred from the processing block, based on the media clock, and to transfer the converted command, address, and data; and
   one or more memory devices configured to operate in synchronization with the media clock, and to write the data transferred from the back side interface therein in response to the command and address transferred from the back side interface,
   wherein the back side interface further comprises:
   a first delay locked loop configured to generate a first data strobe signal for strobing data to be transferred to the one or more memory devices from the back side interface, by using the media clock.

2. The memory module of claim 1, wherein the frequency of the media clock is lower than the frequency of the host clock.

3. The memory module of claim 1, wherein the phase locked loop generates the media clock by using the host clock as a reference clock.

4. The memory module of claim 1, wherein the back side interface further comprises:
   an oscillator configured to generate a reference clock,
   wherein the phase locked loop generates the media clock by using the reference clock.

5. The memory module of claim 1, wherein the back side interface further comprises:
   a divider configured to generate the division clock by dividing the media clock.

6. The memory module of claim 1, wherein each of the one or more memory devices comprises:
   a second delay locked loop configured to generate a second data strobe signal for strobing data to be transferred to the back side interface from the one or more memory devices, by using the media clock.

7. The memory module of claim 6, wherein the front side interface comprises:
a third delay locked loop configured to generate a third data strobe signal for strobing data to be transferred to the host memory controller from the front side interface, by using the host clock.

8. The memory module of claim 1, wherein the back side interface serial-to-parallel converts data transferred from the one or more memory devices and transfers the converted data to the processing block, and the front side interface parallel-to-serial converts data transferred from the processing block and transfers the converted data to the host memory controller.

9. The memory module of claim 1, further comprising:
a first domain crossing circuit configured to perform domain crossing between the front side interface and the processing block; and
a second domain crossing circuit configured to perform domain crossing between the processing block and the back side interface.

10. The memory module of claim 1, wherein the processing block comprises:
a control signal processing block configured to process the command and address from the front side interface to the back side interface in synchronization with the division clock; and
a data processing block configured to process the data from the front side interface to the back side interface in synchronization with the division clock.

11. The memory module of claim 10, wherein the control signal processing block transfers the command and address transferred from the front side interface to the back side interface, and performs an operation instructed by the command and address transferred from the front side interface.

12. The memory module of claim 10, wherein the data processing block comprises:
an error correction code generation circuit configured to generate an error correction code by using the data transferred from the front side interface; and
an error correction circuit configured to correct an error of data transferred from the back side interface by using an error correction code transferred from the back side interface,
wherein the back side interface parallel-to-serial converts the error correction code transferred from the processing block together with the data transferred from the processing block, and
in the one or more memory devices, the error correction code transferred from the back side interface is written together with the data transferred from the back side interface.

13. The memory module of claim 1, wherein the front side interface, the processing block, and the back side interface are included in a module controller.

14. A memory module comprising:
a front side interface configured to include a first command/address receiving unit that receives an address and a command from a host memory controller, a first data transmitting/receiving unit that transmits/receives data to/from the host memory controller, a first clock receiving unit that receives a host clock from the host memory controller, and a first serializer/deserializer that serial-to-parallel converts the command and address received from the first command/address receiving unit, based on the host clock received from the first clock receiving unit, to transfer the converted command, address, and data to a processing block, and parallel-to-serial converts data transferred from the processing block to transfer the converted data to the first data transmitting/receiving unit;
the processing block configured to operate in synchronization with a division clock, and include a control signal processing block that processes the command and address transferred from the front side interface, and transfer the processed command and address to a back side interface, and a data processing block that generates an error correction code by using the data transferred from the front side interface, and corrects an error of data transferred from the back side interface by using an error correction code transferred from the back side interface;
the back side interface configured to include a phase locked loop that generates a media clock having a frequency different from a frequency of the host clock, a second serializer/deserializer that parallel-to-serial converts the command, address, data, and error correction code transferred from the processing block, based on the media clock, and serial-to-parallel converts data and an error correction code transferred from one or more memory devices, a command/address transmitting unit that transmits the command and address transferred from the second serializer/deserializer, a second data transmitting/receiving unit that transmits/receives the data and the error correction code between the second serializer/deserializer and the one or more memory devices, and a clock transmitting unit that transmits the media clock; and
the one or more memory devices configured to operate in synchronization with the media clock,
wherein each of the one or more memory devices comprises:
a second clock receiving unit configured to receive the media clock transferred from the clock transmitting unit;
a second command/address receiving unit configured to receive the command and address transferred from the command/address transmitting unit; and
a third data transmitting/receiving unit configured to transmit/receive the data and the error correction code to/from the second data transmitting/receiving unit.

15. The memory module of claim 14, wherein the frequency of the media clock is lower than the frequency of the host clock.

16. The memory module of claim 14, wherein the back side interface further comprises:
a divider configured to generate the division clock by dividing the media clock.

17. The memory module of claim 14, wherein the front side interface further comprises:
a first delay locked loop configured to generate a first data strobe signal for strobing the data to be transmitted from the first data transmitting/receiving unit, by using the host clock,
the back side interface further comprises:
a second delay locked loop configured to generate a second data strobe signal for strobing the data and the error correction code to be transmitted from the second data transmitting/receiving unit, by using the media clock, and each of the one or more memory devices comprises:
a third delay locked loop configured to generate a third data strobe signal for strobing the data and the error correction code to be transmitted from the third data transmitting/receiving unit, by using the media clock.

18. The memory module of claim 14, the front side interface comprises:
a first domain crossing circuit configured to perform domain crossing between the front side interface and the processing block, and
the back side interface comprises:
a second domain crossing circuit configured to perform domain crossing between the processing block and the back side interface.

19. The memory module of claim 14, wherein the control signal processing block transfers the command and address transferred from the front side interface to the back side interface, and performs an operation instructed by the command and address transferred from the front side interface.

* * * * *